United States Patent
Teplinsky et al.

(10) Patent No.: US 12,339,305 B2
(45) Date of Patent: *Jun. 24, 2025

(54) METHOD AND SYSTEM FOR REAL TIME OUTLIER DETECTION AND PRODUCT RE-BINNING

(71) Applicant: Optimal Plus Ltd., Holon (IL)

(72) Inventors: Shaul Teplinsky, San Francisco, CA (US); Arie Peltz, Ness Ziona (IL); Dan Sebban, Rishon LeZion (IL)

(73) Assignee: OPTIMAL PLUS LTD., Holon (IL)

( * ) Notice: Subject to any disclaimer, the term of this patent is extended or adjusted under 35 U.S.C. 154(b) by 20 days.

This patent is subject to a terminal disclaimer.

(21) Appl. No.: 18/511,705

(22) Filed: Nov. 16, 2023

(65) Prior Publication Data

US 2024/0159813 A1      May 16, 2024

Related U.S. Application Data

(63) Continuation of application No. 17/863,261, filed on Jul. 12, 2022, now Pat. No. 11,852,668, which is a
(Continued)

(51) Int. Cl.
*G01R 31/01* (2020.01)
*B07C 5/344* (2006.01)
*G01R 31/317* (2006.01)

(52) U.S. Cl.
CPC .............. *G01R 31/01* (2013.01); *B07C 5/344* (2013.01); *G01R 31/31718* (2013.01)

(58) Field of Classification Search
None
See application file for complete search history.

(56) References Cited

U.S. PATENT DOCUMENTS

| 6,338,148 | B1 * | 1/2002 | Gillenwater | ........ G06F 11/2273 |
| | | | | 714/25 |
| 11,402,419 | B2 | 8/2022 | Teplinsky et al. | |

(Continued)

OTHER PUBLICATIONS

Non-Final Office Action from corresponding U.S. Appl. No. 16/682,925, dated Dec. 8, 2021.
(Continued)

*Primary Examiner* — Mark D Featherstone
*Assistant Examiner* — Matthew W Wahlin
(74) *Attorney, Agent, or Firm* — Harness, Dickey & Pierce, P.L.C.

(57) ABSTRACT

A method for analyzing device test data includes accessing a core analytics rule that is based on manufacturing data of a plurality of devices. Each of the plurality of devices are produced in one of a plurality of manufacturing facilities and are of a same type as a first device being tested on a tester. The method also includes receiving initial test results of a plurality of other devices of a same type tested at a testing facility, generating, based on the initial test results, an edge analytics rule, modifying the core analytics rule based on the edge analytics rule, wherein the modified core analytics rule including modified binning limits, applying the modified core analytics rule to testing data obtained by testing the first device, and determining, based on applying the modified core analytics rule, that the first device is an outlier with respect to the modified binning limits.

12 Claims, 5 Drawing Sheets

Related U.S. Application Data continuation of application No. 16/682,925, filed on Nov. 13, 2019, now Pat. No. 11,402,419.

(60) Provisional application No. 62/760,327, filed on Nov. 13, 2018.

(56) References Cited

U.S. PATENT DOCUMENTS

| | | | | |
|---|---|---|---|---|
| 2003/0144810 A1* | 7/2003 | Tabor | ............... | H01L 22/20 |
| | | | | 702/108 |
| 2006/0085155 A1* | 4/2006 | Miguelanez | ....... | G01R 31/2836 |
| | | | | 702/118 |
| 2011/0000829 A1* | 1/2011 | Linde | ............ | B07C 3/12 |
| | | | | 209/571 |
| 2013/0275073 A1 | 10/2013 | Arnold et al. | | |

OTHER PUBLICATIONS

Notice of Allowance from corresponding U.S. Appl. No. 16/682,925, dated Mar. 28, 2022.
Non-Final Office Action from corresponding U.S. Appl. No. 17/863,261, dated Mar. 29, 2023.
Notice of Allowance from corresponding U.S. Appl. No. 17/863,261, dated Aug. 17, 2023.

* cited by examiner

METHOD AND SYSTEM FOR REAL TIME OUTLIER DETECTION AND PRODUCT RE-BINNING

CROSS-REFERENCE TO RELATED APPLICATIONS

This application is a continuation of U.S. patent application Ser. No. 17/863,261, filed Jul. 12, 2022, entitled "METHOD AND SYSTEM FOR REAL TIME OUTLIER DETECTION AND PRODUCT RE-BINNING," which is a continuation of U.S. patent application Ser. No. 16/682,925, filed Nov. 13, 2019, entitled "METHOD AND SYSTEM FOR REAL TIME OUTLIER DETECTION AND PRODUCT RE-BINNING," which claims the benefit of U.S. Provisional Patent Application No. 62/760,327, filed Nov. 13, 2018, entitled "METHOD AND SYSTEM FOR REAL TIME OUTLIER DETECTION AND PRODUCT RE-BINNING", the disclosures of which are hereby incorporated by reference in their entirety.

U.S. Pat. No. 9,885,751, issued Feb. 6, 2018, U.S. Pat. No. 8,872,538, issued Oct. 28, 2014, U.S. Pat. No. 8,421,494, issued Apr. 16, 2013, U.S. Pat. No. 7,969,174, issued Jun. 28, 2011, U.S. Pat. No. 7,567,947, issued Jul. 28, 2009, U.S. Pat. No. 7,528,622, issued May 5, 2009, and U.S. application Ser. No. 12/497,789, filed on Jul. 6, 2009, are hereby incorporated herein by reference in their entireties for all purposes.

SUMMARY OF THE INVENTION

Methods and systems for real time outlier detection and product re-binning are provided.

According to various aspects there is provided a method for identifying outlier devices during testing. In some aspects, the method may include: establishing binning limits for a device being tested based on one or more rules generated from external test results data of tests involving similar devices; receiving test results data in real time for the device being tested while the device is on a device tester; applying the one or more rules to the test results data for the device in real time; determining in real time, based on results of applying the one or more rules to the test results data, whether the device is an outlier with respect to the binning limits; and in response to determining that the device is an outlier, binning the outlier device separately from tested devices having test results data falling within the binning limits.

According to various aspects there is provided a system. In some aspects, the system may include: a central rule engine configured to generate one or more rules for taking actions with respect to testing of a device based on external test results data of tests involving similar devices; a local rule engine configured to receive the one or more rules; and a station controller configured to receive test results data in real time for a device being tested and transmit the test results data to the local rule engine in real time. The one or more rules comprise binning limits for the device being tested. The local rule engine may be configured to apply the one or more rules to the test results data for the device in real time, and determine in real time, based on results of applying the one or more rules to the test results data, whether the device is an outlier with respect to the binning limits. In response to determining that the device is an outlier, the local rule engine may bin the outlier device separately from tested devices having test results data falling within the binning limits.

According to various aspects there is provided a non-transitory computer readable medium. The non-transitory computer readable medium may include instructions for causing one or more processors to execute operations to perform a method for identifying outlier devices during testing. In some aspects, the operations may include: establishing binning limits for a device being tested based on one or more rules generated from external test results data of tests involving similar devices; receiving test results data in real time for the device being tested while the device is on a device tester; applying the one or more rules to the test results data for the device in real time; determining in real time, based on results of applying the one or more rules to the test results data, whether the device is an outlier with respect to the binning limits; and in response to determining that the device is an outlier, binning the outlier device separately from tested devices having test results data falling within the binning limits.

According to various aspects there is provided a system for analyzing device test data. In some aspects, the system may include: a first rule engine configured to generate a first rule based on test results from a device being tested on a tester at a testing facility and a second rule, and to define and initiate a first action while the device is on the tester based on applying the first rule to the test results of the device; a second rule engine configured to generate the second rule based on test results of a first plurality of other devices of the same type tested at the testing facility and a third rule, and to define and initiate a second action when the device is no longer on the tester based on applying the second rule to the test results of the device; and a third rule engine configured to generate the third rule based on manufacturing data of a second plurality of other devices of the same type from a plurality of manufacturing facilities when the device is no longer on the tester.

Numerous benefits are achieved by way of the various embodiments over conventional techniques. For example, the various embodiments provide a central processor for generation of rules for real time evaluation of device test results data based on a pool of external test results data unavailable to local processors. In some embodiments, the external test results data used to generate the rules may include test results data for similar devices at device level, subassembly level, product level, etc., as well as failure analysis test results data. These and other embodiments along with many of its advantages and features are described in more detail in conjunction with the text below and attached figures.

Other features and advantages should be apparent from the following description which illustrates by way of example aspects of the various teachings of the disclosure.

BRIEF DESCRIPTION OF THE DRAWINGS

Aspects and features of the various embodiments will be more apparent by describing examples with reference to the accompanying drawings, in which.

DETAILED DESCRIPTION OF SPECIFIC EMBODIMENTS

While certain embodiments are described, these embodiments are presented by way of example only, and are not intended to limit the scope of protection. The apparatuses, methods, and systems described herein may be embodied in a variety of other forms. Furthermore, various omissions, substitutions, and changes in the form of the example methods and systems described herein may be made without departing from the scope of protection.

Test operations involved in the manufacturing of electronic devices are commonly performed using Automated Test Equipment (ATE), often in conjunction with and under limited control of a test station host computer. After device testing has been performed, a handler places the devices into physically separate containers referred to as "bins" under direction of a control program, and according to the test results of each individual device. Binning signals that are passed from the ATE to the handler instruct the handler to physically place the devices in the indicated bins. Typically, devices are sorted according to whether they passed or failed testing, and further may be classified and sorted according to passing and failing sub-categories. Test limits may be, for example, but not limited to, Test Program (SPEC) limits, Static Process Limits (SPL) and Part Average Test (PAT) limits.

Devices that pass testing may be classified and sorted based on device performance during testing according to varying test result limits. The classifications based on test result limits are typically predetermined and programmed into the ATE. In some cases, the classifications may be modified, either manually, for example by a test engineer, or automatically via feedback from the ATE from test results data obtained at the test facility. However, a manufacturer may produce devices of the same type at multiple locations across a country or even across the world. Test results data for any individual manufacturing location, while typically available at a central "headquarters" location, is not available to other manufacturing locations. As a result, devices manufactured at one location can be classified and sorted differently that the same devices manufactured at another location. Thus, the same type devices manufactured at different locations can have inconsistent characteristics for devices of the same classification.

Further, devices may be incorporated into higher level assemblies and the higher level assemblies may be built into products. Testing may take place at each level of assembly and test data may be collected. The test data from the various levels of testing may be correlated with specific devices and may be available to the central "headquarters" location.

Figure 1:
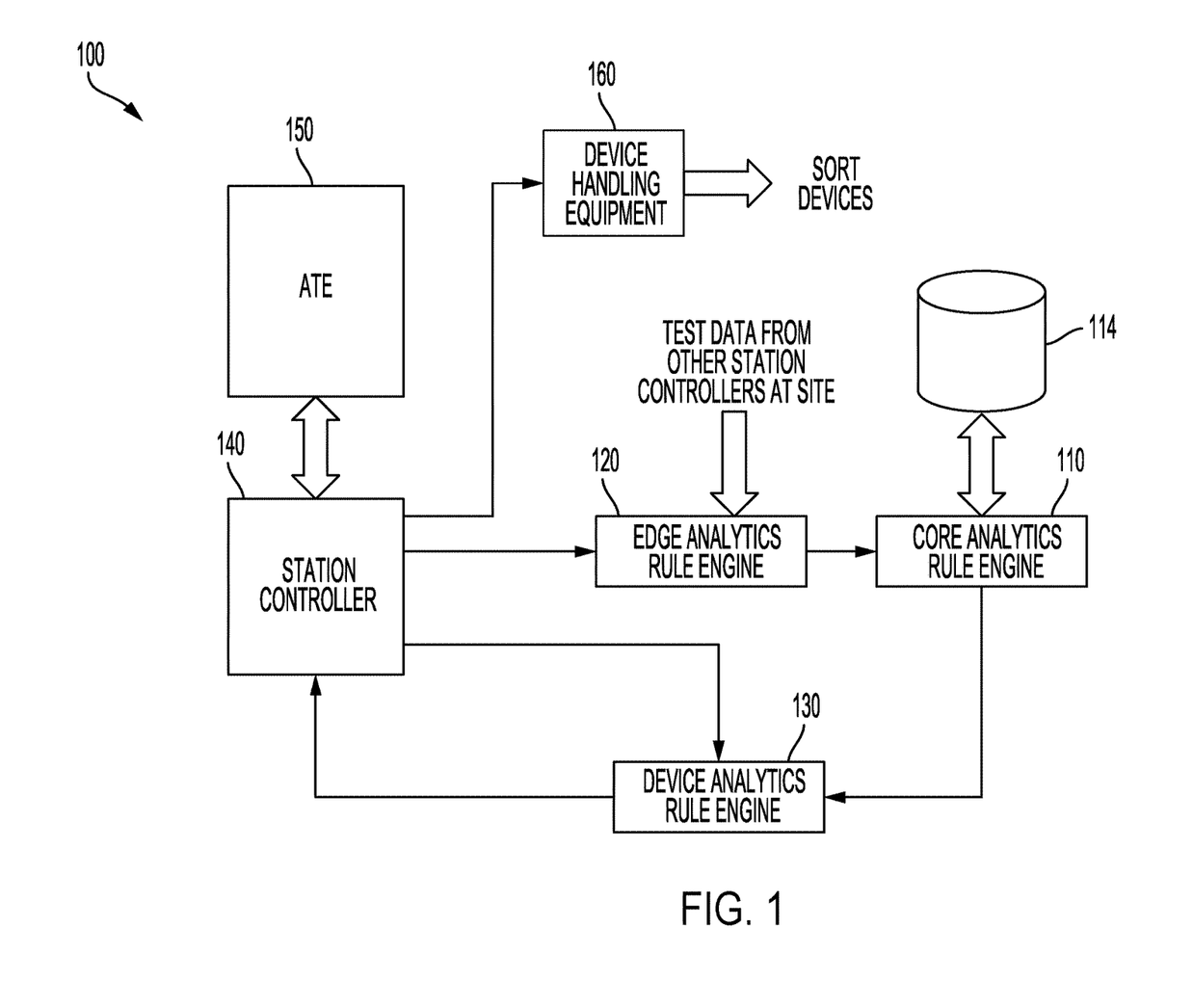
FIG. 1 is a simplified block diagram of a system for outlier detection and product re-binning in real-time according to various aspects of the present disclosure.

FIG. 1 is a simplified block diagram of a system 100 for outlier detection and product re-binning in real-time according to various embodiments. As used herein, the term "real time" means during a time period that testing is being performed. As illustrated in FIG. 1, the system may include a core analytics rule engine 110, an edge analytics rule engine 120, a device analytics rule engine 130, a test station controller 140, automated test equipment (ATE) 150, and device handling equipment 160.

Each of the core analytics rule engine 110, edge analytics rule engine 120, device analytics rule engine 130, and test station controller 140 may be implemented by a processor, for example but not limited to a microprocessor, microcomputer, CPU, microcontroller, etc. One of ordinary skill in the art will appreciate that while the edge analytics rule engine 120 and the device analytics rule engine 130 are illustrated as separate blocks, their functions may be performed by separate components or may be performed by a single component without departing from the scope of the present disclosure. Each of the core analytics rule engine 110, edge analytics rule engine 120, and device analytics rule engine 130 may be connected via a network, for example, the Internet or another network, and may be configured to communicate over the network.

The core analytics rule engine 110 may be centrally located, for example at a company headquarters, and may be connected via a network, for example, the Internet or another network, to co-located facilities as well as facilities at different geographic locations. The core analytics rule engine 110 may receive test results data from a plurality of edge analytic rule engines from facilities at different geographic locations (i.e., edge facilities) as well as from a plurality of other sources, for example, but not limited to, third party test facilities, product manufacturers (including production test and failure analysis data), etc. The core analytics rule engine 110 may have access to a plurality of external data from multiple facilities and/or third party sources that is not typically available to any particular edge analytic rule engine. Thus, the core analytics rule engine 110 may create rules and static process limits (SPL) that are universally useful and current. The rules may be, for example, but not limited to, algorithms that specify actions to be taken based on evaluation of data input to the algorithm.

Data received for the core analytics rule engine 110 may be stored in a database 114 that may be co-located, for example at the company headquarters, with the core analytics rule engine 110. Alternatively, the database 114 may be situated at a location other than at the location of the core analytics rule engine 110 and may be accessible via a network, for example, the Internet or another network, by the core analytics rule engine 110.

The SPL may be calculated periodically (off-line) by the core analytics rule engine 110 based on historical data. As used herein, the term "off-line" indicates that a rule engine or other device is available to perform operations while not in active communication with other rule engines or other devices. The SPL calculated by the core analytics rule engine 110 may be published to the device analytics rule engine 130 and applied by the device analytics rule engine 130 to each new lot of devices tested in addition to the applied ATE test program limits.

The SPL may be calculated by the core analytics rule engine 110 in the central location based on combined external data available from the plurality of testing and manufacturing facilities. The core analytical rule engine 110 may consider test data from a same product in other facilities, test data from previous test operations, fabrication data, etc., for calculating the SPL. For instance, the core analytics rule engine 110 may use test data from a previous test operation that measures a similar test parameter and set SPL to limit amount of allowed shift from a previous test operation.

In another instance, the core analytics rule engine 110 may use a distribution of a same test parameter as seen historically across multiple testing sites and set SPL to limit drift of the test parameter away from the combined distribution. In another instance, the core analytics rule engine 110 may use historical reliability data and current manufacturing data from manufacturing execution systems (IVIES) for the product and tighten the SPL threshold for units (e.g., lots) of product supplied from a manufacturing facility that historically produced products with higher reliability risk. One of ordinary skill in the art will appreciate that these are only examples of data that may be used and that other data collected from other external sources may be included without departing from the scope of the present disclosure.

The SPL may be calculated by the core analytics rule engine 110 on a fixed schedule (e.g., weekly, etc.), or may be recalculated upon demand if a change in SPL is anticipated. The core analytics rule engine 110 receives the external data for calculating the SPL from database 114. The SPL for each product may be published to each testing facility (i.e., edge facility) from the core analytics rule engine 110 at the central facility periodically (weekly, etc.) or upon demand so that the SPL are ready to be published to ATE during lot introduction.

In addition to calculating SPL, the core analytics rule engine 110 may also define or update rules (i.e., first rules). The first rules may be defined (created and validated) off-line based on historical data from the external sources available to the core analytics rule engine 110. The first rules may be activated by the station controller 140 and applied by the device analytics rule engine 130 in real-time to each new lot tested. The first rules may be active within a scope of a run. The first rules may be continuously applied in real-time by the device analytics rule engine 130 to test results data received from ATE to make decisions and send actions accordingly (on-line). As used herein, the term "on-line" indicates that a rule engine or other device is available perform operations involving active communications with other rule engines or devices. Examples of first rules defined by the core analytics rule engine 110 may include:

1. Adaptive Test Time Reduction (TTR)—adaptively augments a test routine to skip tests to reduce test time (e.g., abort on slow test). A threshold to abort may be determined based on historical test time, test time from other similar ATE testing the same product in the same test facility or in other test facilities. Examples of systems and methods for adaptive test time reduction may be found in U.S. Pat. Nos. 7,528,622, 7,969,174, 8,421,494, and 8,872,538 incorporated herein by reference.
2. Bin Monitor—monitors distribution of bins and alert for outliers, for example, alert if too many units are failing Bin 8. A threshold may be determined based on historical quantities of units binned to Bin 8.
3. Freeze—detects that ATE is "frozen"—generates a fixed test data, e.g., monitor variability (i.e., sigma) of a test that historically has high variation.
4. Parametric Process Capability—calculates and monitors process and metrology capability measures (Cpk, Gage Repeatability and Reproducibility (R&R)).
5. Parametric Trend—detects shifts and drifts in test results, e.g., compare current test result to test results from previous test operations.
6. Site-to-Site Deviations—detects unexpected differences in test results between sites during parallel testing.
7. Tester Settings—validates that ATE settings and configuration are correct, for example, compare current operation with operation in cases where ATE is under control of an entity different from second rules provided by the core analytics rule engine 110.
8. Machine Learning based System Level Test (SLT) reduction—predicts SLT outcome and skips SLT on units that are unlikely to fail. The core analytics rule engine 110 may apply machine learning to historical SLT and/or Burn-In outcomes and test data from preceding test operations to build a model predicting an outcome of Burn-In or of SLT based on the test data. A rule may be defined based on the model for deciding whether a new unit being tested at the test operation is to skip SLT and/or Burn-In based on its test data.

One of ordinary skill in the art will appreciate that the listed first rules are exemplary and that other rules may be defined without departing from the scope of the present disclosure.

The core analytics rule engine 110 may generate the first rules and validate them (i.e., ensure that rule outcome is consistent with the expectations) based on the external test data available in the database 114. The core analytics rule engine 110 may update the first rules based on newly available external data in order to keep them current. An example rule management system is described in U.S. Pat. No. 7,567,947 incorporated herein by reference. The core analytics rule engine 110 at the central facility may publish the first rules for each product to the edge analytics rule engines 120 at each testing facility on a periodic basis (e.g., weekly, etc.) or upon demand so the first rules are ready to be activated during lot introduction and applied during a run.

The edge analytics rule engine 120 may be similar to the core analytics rule engine 110 with the exception that the edge analytics rule engine 120 only has access to data from the facility in which it is located and therefore any rules (i.e., second rules) and SPL generated by the edge analytics rule engine 120 are more limited in scope. The second rules may be generated by the edge analytics rule engine 120 at each location where devices are tested from test results data and device binning data for device testing performed at the geographic location. The SPL and the second rules generated by the edge analytics rule engine 120 are typically product specific, i.e., the rules and SPL may vary from product to product. Upon lot introduction to the ATE, the station controller 140 receives information identifying the product, e.g., product name, facility, test program, etc., selects applicable SPL and activates applicable second rules based on this information.

The device analytics rule engine 130 may receive real time test data from the station controller 140, apply SPL and/or first or second rules identified by the station controller 140 to the test data, and make a decision that is communicated to the ATE via the station controller 140. For example, the device analytics rule engine 130 may "overwrite" the binning that was decided by the ATE program with its own final binning assignment, decide to abort the testing, issue an alert, augment the test sequence. An example binning system is described in U.S. patent application Ser. No. 12/497,798, and an example system for modifying execution of a test sequence is described in U.S. Pat. No. 9,885,751, both of which are incorporated herein by reference. In accordance with various aspects of the present disclosure, the device analytics rule engine 130 may be implemented as part of the station controller 140.

The device analytics rule engine 130 may define a third rule. The third rule may be defined by modifying a first or second rule obtained from the core analytics rule engine 110 or the edge analytics rule engine 120, respectively, by creating a new rule from scratch, or by combining multiple rules and/or SPLs. For instance, if the first rule obtained from the core analytics rule engine 110 is a PAT rule that specifies a "local" baseline to calculate the test limits, the device analytics rule engine 130 may calculate the baseline based on test data it collected so far on the current lot. The device analytics rule engine 130 may define a new third rule with the limits based on the "local" baseline. The third rule may specify how PAT limits are to be calculated or recalculated, for example, a number of units to consider for a baseline, a time period to consider, how far from baseline to set the limits, etc. In some cases, the device analytics rule engine 130 may in real time combine multiple sets of limits. For example a new third rule may be defined to apply a set of limits which is a logical "AND" of the SPEC limits, the SPL from the station controller 140, and the PAT limits it calculated, to determine a final binning assignment The device analytics rule engine 130 may receive real time device test results data from the station controller 140, apply first, second, or third rules to the test results data in real-time to generate one or more instructions to modify device binning in real time before the device under test is removed from the ATE. The device analytics rule engine 130 may transmit the instructions to the test station controller 140. Based on the instructions received from the device analytics rule engine 130, the test station controller 140 may provide modified binning instructions to the device handling equipment 160 for binning of devices that pass ATE test.

The ATE 150 may perform functional testing of devices and provide test results data to the test station controller 140. The test station controller 140 may provide binning instructions to the device handling equipment 160. The device analytics rule engine 130 may modify the device binning instructions by applying in real-time rules received from the edge analytics rule engine 120, the core analytics rule engine 110, or rules generated by the device analytics rule engine 130 itself to the test results data.

Figure 2:
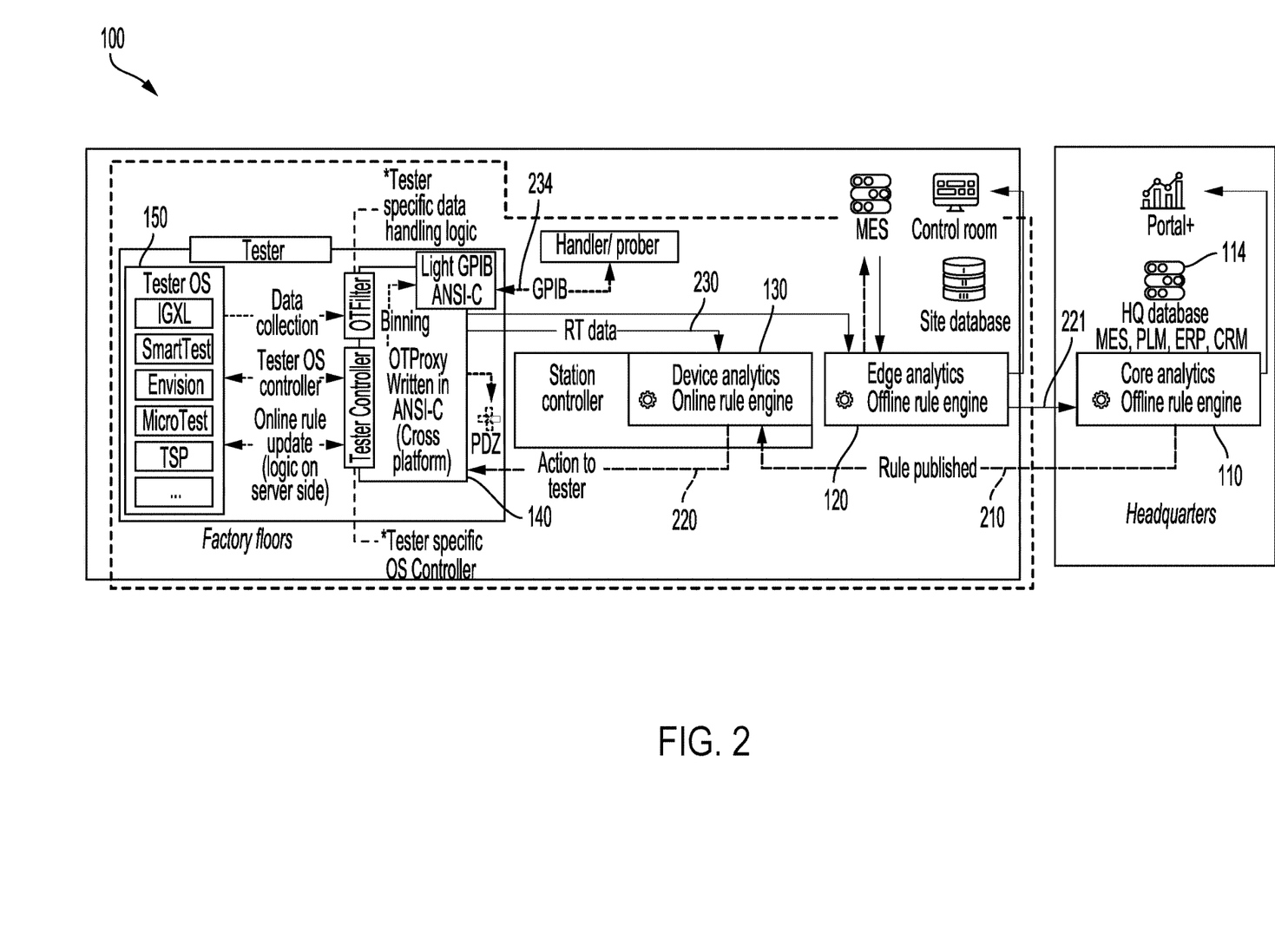
FIG. 2 is a more detailed block diagram of the system for outlier detection and product re-binning in real-time according to various aspects of the present disclosure.

FIG. 2 is a more detailed block diagram of the system 100 for outlier detection and product re-binning in real-time according to various embodiments. Binning of tested devices may be performed based on limits provided by rules generated by the core analytics rule engine 110 using external data received from a plurality of sources. The core analytics rule engine 110 may be centrally located, for example but not limited to, at a headquarters location of a company. Device test results data may be collected at the headquarters location from multiple external sites, for example but not limited to device test sites, device manufacturing facilities, etc.

The core analytics rule engine 110 may receive the external test results data collected from the multiple sites and/or multiple levels of test, for example, but not limited to, third party test facilities, product manufacturers (including production test and failure analysis data), etc., for a particular device type. The external test results data may include, for example but not limited to, upper and lower static process limits (SPL) for binning of a particular device type at the corresponding locations. One of ordinary skill in the art will appreciate that other types of test results data may be included in the external test results data without departing from the scope of the present disclosure. Data received for the core analytics rule engine 110 may be stored in a database 114 that may be co-located with the core analytics rule engine 110 or may be situated at a location other than at the location of the core analytics rule engine 110.

The core analytics rule engine 110 may analyze the received external test results data generate one or more first rules 210 based on the received external test results data. The one or more first rules may include static process limits (SPL). The core analytics rule engine 110 may have access to a plurality of external data from multiple facilities and/or third party sources that is not typically available to any particular edge analytic rule engine. For example, the core analytics rule engine 110 may generate a first rule 210 based on the received external test results data that applies upper and lower SPL for binning of tested devices.

The core analytics rule engine 110 may publish the one or more first rules 210 to the device analytic rule engines 130 and/or the edge analytics rule engines 120 for each of the plurality of facilities at different geographic locations. The core analytics rule engine 110 may publish the one or more first rules 210 on a periodic basis, for example once per week or another time period, or may publish the one or more first rules 210 on demand. At each of the different geographic locations, when a new lot of the particular device type is tested by the automated test equipment (ATE) 150, the device analytic rule engines 130 and/or the edge analytics rule engines 120 may select an appropriate first rule 210 (e.g., a rule related to a particular device type being tested) and transmit the first rule 210 to the test station controller 140 configured to accept the input from the device analytic rule engines 130 and/or the edge analytics rule engines 120.

The test station controller 140 may receive the test data results of each sequential device test and transmit the test data results of the device to the device analytic rule engine 130 in real-time. The device analytic rule engine 130 may apply the first rule 210 generated based on external test results data to the test data results for the device in real-time before the device leaves the ATE 150. For example, application of the first rule 210 to the test data results for the device may cause the device to be binned according to the first rule 210 rather than according to the binning instructions 234 from the ATE 150. The test station controller 140 may cause binning instructions to be sent to the device handling equipment 160 to sort devices according to the first rule 210. Thus, a device may pass testing by the ATE 150 but may not comply with the first rule, i.e., may be an outlier, and will therefore be binned differently than the devices that pass test and comply with the first rule.

The test station controller 140 may also periodically transmit the device test data results to the edge analytics rule engine 120. The edge analytics rule engine 120 may analyze the device test data results to generate a second rule that may be more appropriate for the testing conducted at the associated facility. The edge analytics rule engine 120 only has access to data from the facility in which it is located and therefore any rules (i.e., second rules) and SPL generated by the edge analytics rule engine 120 are more limited in scope. The edge analytics rule engine 120 may periodically transmit device test results data 221 to the core analytics rule engine 110 (and the database 114). Thus, the core analytics rule engine 110 may update and transmit the first rule 210 to the multiple sites periodically or on demand.

In accordance with various aspects of the present disclosure, the device analytics rule engine 130 may define a third rule. The third rule may be defined by modifying a first or second rule obtained from the core analytics rule engine 110 or the edge analytics rule engine 120, respectively, by creating a new rule from scratch, or by combining multiple rules and/or SPLs.

Figure 3:
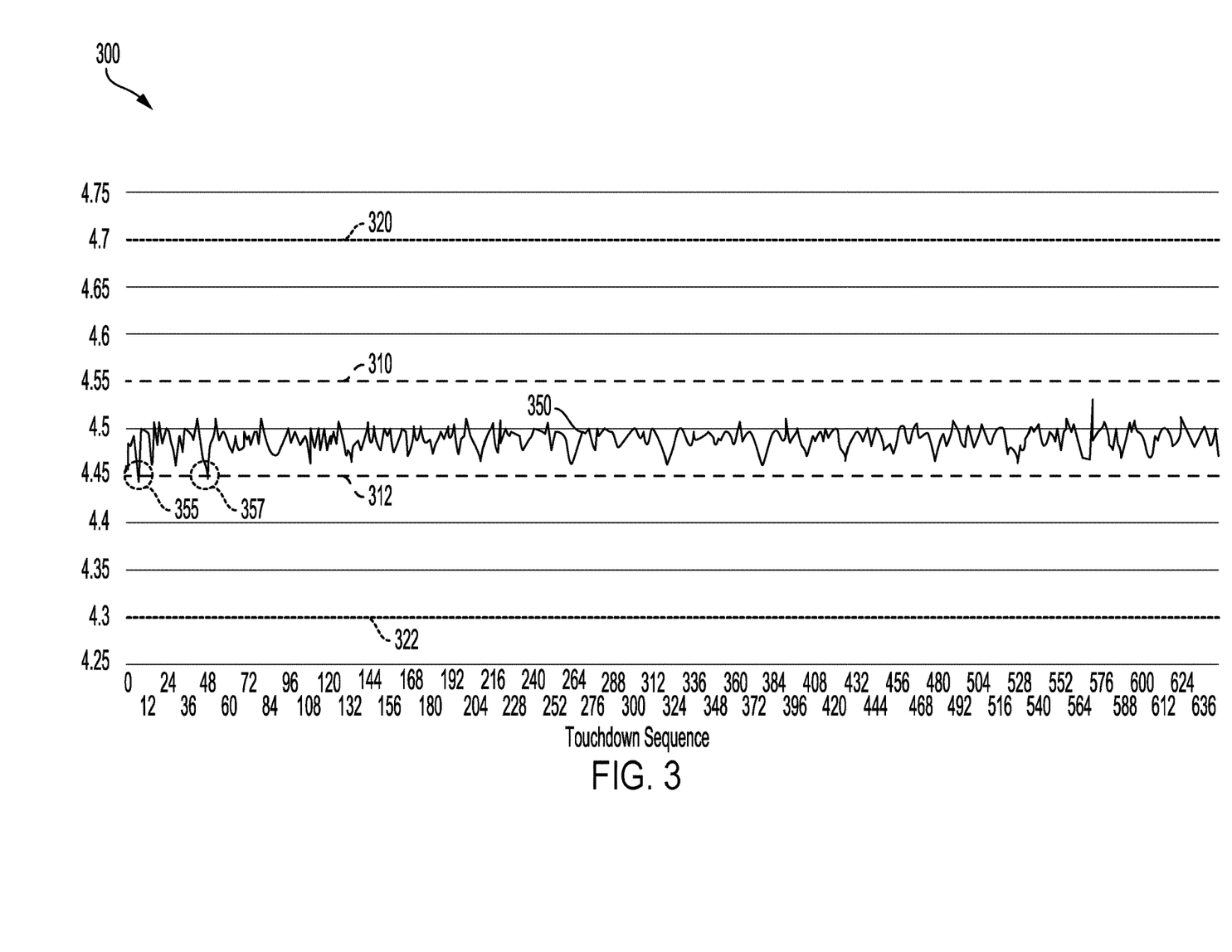
FIG. 3 is a plot illustrating upper and lower static process limits (SPL) provided by a rule generated by the core analytics rule engine according to various aspects of the present disclosure.

FIG. 3 is a plot 300 illustrating upper and lower SPL provided by a rule generated by the core analytics rule engine 110 in accordance with various aspects of the present disclosure. As illustrated in FIG. 3, the core analytics rule engine 110 may publish the first rule 210 to the edge analytics rule engine 120 and/or the device analytics rule engine 130, and the edge analytics rule engine 120 and/or the device analytics rule engine 130 may transmit the first rule 210 to the test station controller 140. The first rule 210 may include upper and lower SPL 310, 312 for binning devices that pass ATE 150 testing within the specified upper and lower test limits 320, 322. FIG. 3 shows that the upper and lower SPL 310, 312 for binning devices specified by the first rule 210 are narrower than the specified upper and lower test limits 320, 322 from the ATE 150.

The test results data 350 show a first outlier 355 and a second outlier 357. Although the first outlier 355 and a second outlier 357 in the test data results 350 correspond to devices that pass ATE 150 testing, they are outliers with respect to the upper and lower SPL 310, 312 for binning devices specified by the first rule 210. Therefore, the test station controller 140 may provide binning instructions to the device handling equipment 160 to bin the devices corresponding to the first and second outliers 355, 357 differently than the devices corresponding to the test results 350 that fall within the upper and lower SPL 310, 312 for binning devices specified by the first rule 210 even though the devices corresponding to the first and second outliers 355, 357 passed ATE 150 testing. This re-binning of the devices can occur in real time such that a new bin may be assigned for a device before the device finishes its respective ATE testing.

In accordance with various aspects of the present disclosure, adaptive testing may be performed on real time data from the ATE 150 to adjust the rules generated by the rule engines to modify the binning instructions. Referring to again to FIG. 2, the first rule (i.e., SPL from the core analytics rule engine) 210 based on external test results data may be published to the device analytics rule engine 130 and/or the edge analytics rule engine 120 by the core analytics rule engine 110. The device analytics rule engine 130 and/or the edge analytics rule engine 120 may initially transmit the first rule 210 to the test station controller 140. Real time test results data 230 from the ATE 150 may be received by the test station controller 140 and transmitted to the device analytics rule engine 130.

The device analytics rule engine 130 may calculate values, for example but not limited to a part average test limit (PAT), in real time as devices are being tested, generate a new rule (i.e., the third rule) 220 based on the real time test results data, and transmit the third rule 220 to the test station controller 140. For example, the third rule 220 may provide narrower upper and lower binning limits than the SPL provided by the first rule. The device analytics rule engine 130 may continue to modify the third rule 220 in real time as devices are tested such that the modified third rule may cause re-binning the device currently under ATE 150 testing before it is removed from the ATE 150. The real time upper and lower binning limits specified by the third rule 220 may be modified after sufficient real time device test results data within a device test lot are received by the test station controller 140 and transmitted to the device analytics rule engine 130. Alternatively, the real time upper and lower binning limits specified by the third rule 220 may be modified and applied on a device.

Figure 4:
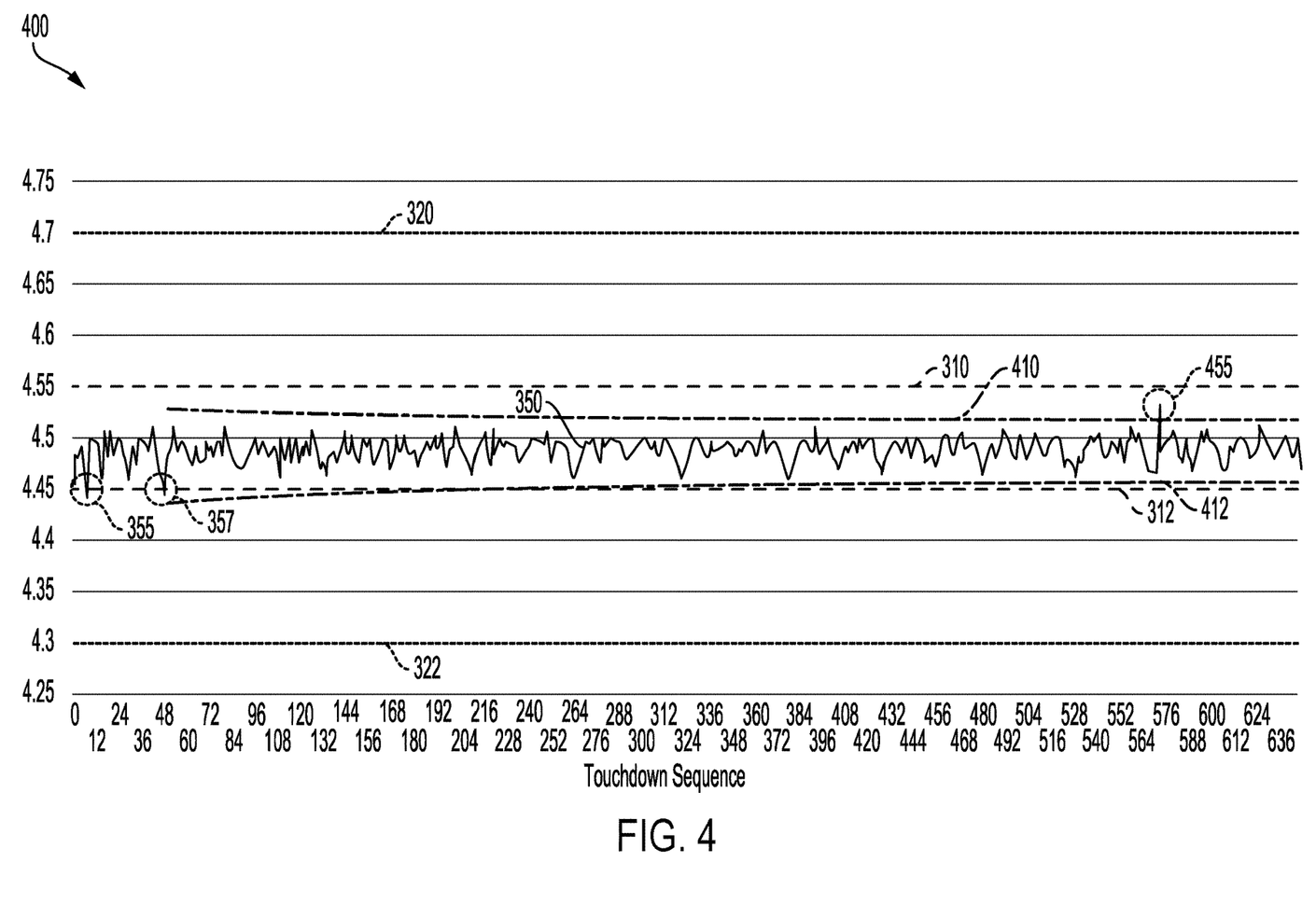
FIG. 4 is a plot illustrating dynamic upper and lower SPL provided by a rule generated in real time by the device analytics rule engine according to various aspects of the present disclosure.

FIG. 4 is a plot 400 illustrating upper and lower SPL provided by a rule generated in real time by the device analytics rule engine 130 in accordance with various aspects of the present disclosure. Referring to FIG. 4, the same test data results 350 are illustrated with the same upper and lower test limits 320, 322 and upper and lower SPL 310, 312 for binning devices as illustrated in FIG. 3. As further illustrated in FIG. 4, real time upper and lower binning limits 410, 412 are provided by the third rule 220 modified in real time by the device analytics rule engine 130 based on the real time test results data 230 from the ATE 150. The real time upper and lower binning limits 410, 412 may be narrower than the upper and lower SPL 310, 312 specified by the first rule 210 for binning devices.

FIG. 4 again shows the first outlier 355 and the second outlier 357 based on the upper and lower SPL 310, 312 for binning devices specified by the first rule 210, and also shows an additional third outlier 455 detected based on the real time upper and lower binning limits 410, 412 provided by the real time modification of the third rule 220 by the device analytics rule engine 130. The upper and lower SPL 310, 312 for binning devices specified by the first rule 210 may be applied until sufficient real time device test results data within a device test lot are collected by the test station controller 140 and transmitted to the device analytics rule engine 130 to calculate values to modify the third rule 220 to provide the real time upper and lower binning limits 410, 412. A number of test points define "sufficient real time device test results data" may be specified for the device analytics rule engine 130 based on a desired statistical confidence and quantities of product units being tested or by another method. Alternatively, the real time upper and lower binning limits 410, 412 may be modified and applied on a device by device basis as each device is tested.

The test station controller 140 may cause binning instructions to be sent to the device handling equipment 160 to bin devices that comply with the real time modified third rule 220 differently than devices that do not comply with the real time modified third rule 220 (i.e., outliers). Thus, additional outlier devices may be detected within tighter limits over time and/or in real time. The currently applied binning rules may be monitored via a user interface at a headquarters location and/or at test locations.

Systems and methods provided in accordance with various aspects of the present disclosure may provide benefits during new product introduction (NPI). During NPI, little or no statistical test information is available for the new product. Conventional systems require many devices to be tested in order to collect and analyze device test results to determine binning limits. In accordance with various aspects of the present disclosure, the device analytics rule engine 130 may establish rules in real-time while devices are still on the ATE 150. The real time rules established by the device analytics rule engine 130 may quickly define upper and lower binning limits and identify outlier devices.

Figure 5:
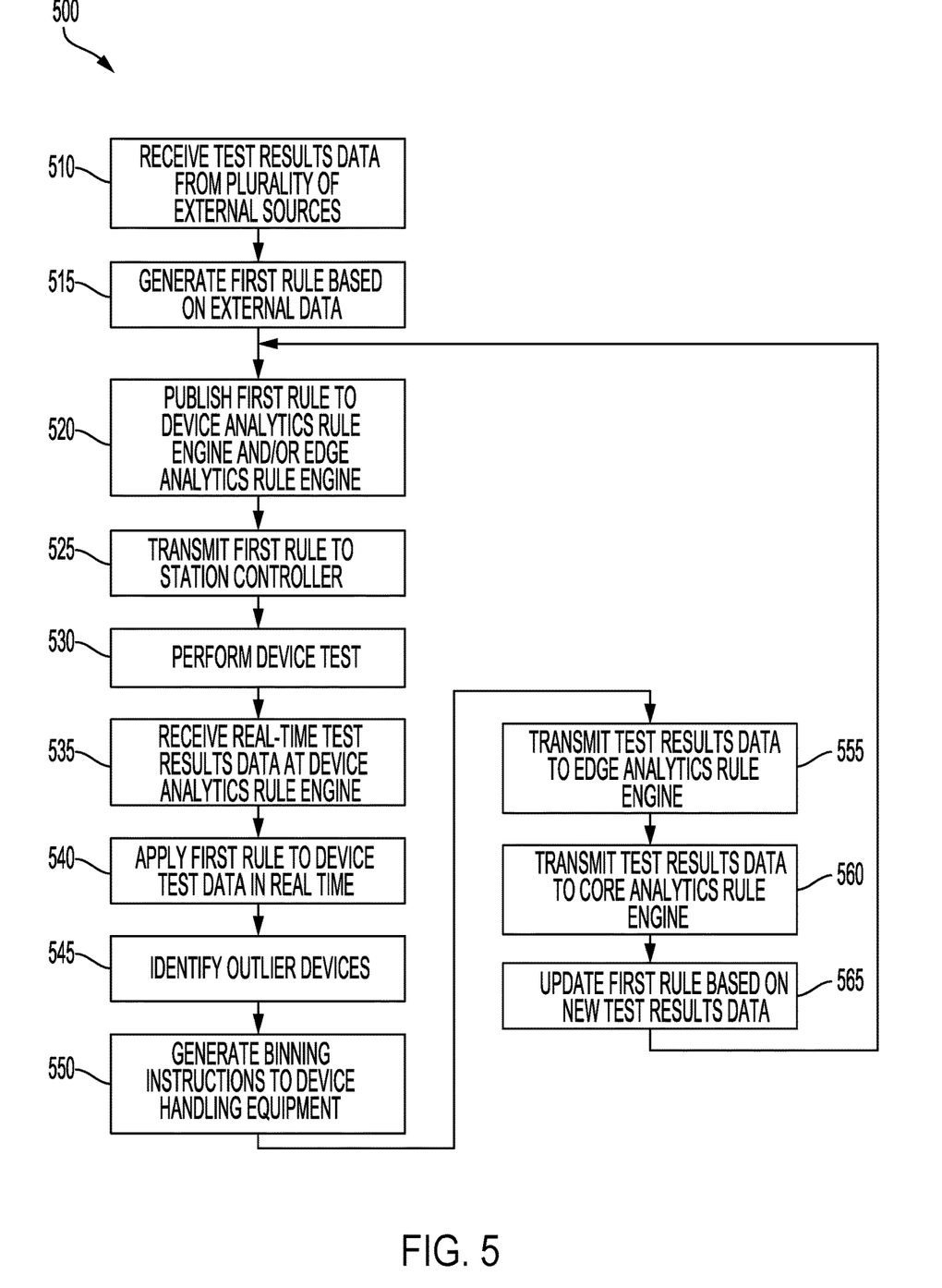
FIG. 5 is a flowchart of a method 500 for outlier detection and product re-binning in real-time according to various aspects of the present disclosure.

FIG. 5 is a flowchart of a method 500 for outlier detection and product re-binning in real-time in accordance with various aspects of the present disclosure. Referring to FIG. 5, at block 510 the core analytics rule engine 110 may receive a plurality of device test data results from a plurality of sources, for example, but not limited to, edge analytic rule engines, third party test facilities, product manufacturers (including production test and failure analysis data), etc., for a particular device type tested in a plurality of different locations and levels of test. At block 515, the core analytics rule engine 110 may generate a first rule 210. For example, the core analytics rule engine 110 may generate one or more first rules 210 based on the external test results data available to the core analytics rule engine 110.

At block 520, the core analytics rule engine 110 may publish the first rule 210 to the device analytic rule engine 130 and/or the edge analytics rule engine 120. The core analytics rule engine 110 may publish the first rule 210 on a periodic basis, for example once per week or another time period. Alternatively, the core analytics rule engine 110 may publish the first rule 210 in real time as additional device test data results are received from test facilities and other sources, for example, but not limited to, third party test facilities, product manufacturers (including production test and failure analysis data), etc., at different geographic locations.

At block 525, the device analytic rule engine 130 and/or the edge analytics rule engine 120 may transmit the first rule to the test station controller 140. For example, when a new lot of the particular device type is tested by the automated test equipment (ATE) 150, the first rule 210 may be transmitted to the test station controller 140. The first rule 210 may specify upper and lower SPL for binning devices that pass ATE 150 testing. At block 530, the ATE 150 may perform a device test.

At block 535, the device analytics rule engine 130 may receive real time test results data for the tested device. For example, real time test results data 230 from the ATE 150 may be received by the test station controller 140 and transmitted to the device analytics rule engine 130. At block 540, the device analytics rule engine 130 may apply the first rule to the test results data in real time. The device analytics rule engine 130 may calculate values, for example but not limited to a part average test limit (PAT), in real time as devices are being tested. The first rule may provide narrower upper and lower binning limits than the SPL provided by the ATE program. The device analytics rule engine 130 may modify the first rule and forward the modified rule to the test station controller 140 in real time based on continually received real time test results data.

At block 545, device analytics rule engine 130 may identify devices that do not fall within the upper and lower binning limits (i.e., outliers) established by the first rule (see FIG. 4). In accordance with various aspects of the present disclosure, the device analytics rule engine 130 may apply the upper and lower SPL for binning devices specified by the first rule 210 until sufficient real time test results data is collected to enable the device analytics rule engine 130 to generate a new rule.

At block 550, the test station controller 140 may cause binning instructions from the device analytics rule engine 130 to be sent to the device handling equipment 160 to bin devices that comply with the real time modified third rule 220 differently than devices that do not comply with the first rule (i.e., outliers).

At block 555, the test station controller 140 may periodically transmit test results data to the edge analytics rule engine 120. The edge analytics rule engine 120 may also generate new rules. However, the edge analytics rule engine 120 only has access to data from the facility in which it is located and therefore any rules (i.e., second rules) and SPL generated by the edge analytics rule engine 120 are more limited in scope. At block 560, the edge analytics rule engine 120 may transmit the test results data to the core analytics rule engine 110. Data received for the core analytics rule engine 110 may be stored in a database 114. At block 565, the core analytics rule engine 110 may update the first rule based on the new test results data from the edge analytics rule engine 120 as well as from other external sources.

The method 500 may be embodied on a non-transitory computer readable medium, for example, but not limited to, a memory, storage device, or other non-transitory computer readable medium known to those of skill in the art, having stored therein a program including computer executable instructions for making a processor, computer, or other programmable device execute the operations of the methods, and may be distributed among the various rule engines and station controllers and associated storage devices as described in accordance with various aspects of the present disclosure.

One of ordinary skill in the art will appreciate that other aspects may be contemplated, for example but not limited to establishing binning rules having multiple process limits defining various performance characteristic (e.g., clock speed, etc.) for the devices that pass ATE testing without departing from the scope of the present disclosure.

The examples and embodiments described herein are for illustrative purposes only. Various modifications or changes in light thereof will be apparent to persons skilled in the art. These are to be included within the spirit and purview of this application, and the scope of the appended claims, which follow.

What is claimed is:

1. A method for analyzing device test data, the method comprising:
    accessing a core analytics rule for testing a device on a tester at a testing facility, the core analytics rule is based on manufacturing data of similar devices produced at different manufacturing locations;
    receiving initial test results of a plurality of other similar devices tested at the testing facility;
    generating, based on the initial test results, an edge analytics rule;
    modifying the core analytics rule based on the edge analytics rule, wherein the modified core analytics rule includes modified binning limits;
    applying the modified core analytics rule to testing data obtained by testing the first device while the first device is still on the tester; and
    determining, based on applying the modified core analytics rule, that the first device is an outlier with respect to the modified binning limits.

2. The method of claim 1 further comprising in response to determining that the first device is an outlier, binning the first device separately from previously tested devices having test results data falling within the modified binning limits.

3. The method of claim 1 wherein the core analytics rule or the edge analytics rule comprises instructions to add or omit tests for the first device.

4. The method of claim 1 wherein the core analytics rule or the edge analytics rule comprises static process limits (SPL) applied to the testing data for the first device.

5. The method of claim 1 further comprising defining and initiating a first action while the first device is on the tester based on applying the modified core analytics rule to testing data obtained by testing the first device.

6. The method of claim 1 further comprising defining and initiating a second action when the first device is no longer on the tester based on applying the modified core analytics rule to testing data obtained by testing the first device.

7. A method for identifying outlier devices during testing, the method comprising:
    establishing one or more rules for testing a device based on test results data of tests involving similar devices produced at different manufacturing locations;
    receiving test results data for the device while the device is on a device tester;

applying the one or more rules that are based on test results data of tests involving similar devices produced at different manufacturing locations to the test results data for the device; and determining, based on results of applying the one or more rules to the test results data for the device, whether the device is an outlier.

8. The method of claim 7 wherein the one or more rules include binning limits.

9. The method of claim 8, further comprising, in response to determining that the device is an outlier, binning the device separately from other tested devices.

10. A system for analyzing device test data, the system comprising:

a central rule engine configured to generate one or more rules for testing a device based on test results data of tests involving similar devices produced at different manufacturing locations;

a local rule engine configured to receive the one or more rules that are based on test results data of tests involving similar devices produced at different manufacturing locations; and a station controller configured to receive test results data for a device being tested and transmit the test results data to the local rule engine;

wherein the local rule engine is configured to apply the one or more rules to the test results data for the device and determine, based on results of applying the one or more rules to the test results data, whether the device is an outlier.

11. The system of claim 10 wherein the one or more rules comprise binning limits for the device being tested.

12. The system of claim 11 wherein the local rule engine is configured to bin the outlier device separately from tested devices having test results data falling within the binning limits.

* * * * *

UNITED STATES PATENT AND TRADEMARK OFFICE
CERTIFICATE OF CORRECTION

| | |
|---|---|
| PATENT NO. | : 12,339,305 B2 |
| APPLICATION NO. | : 18/511705 |
| DATED | : June 24, 2025 |
| INVENTOR(S) | : Shaul Teplinsky et al. |

It is certified that error appears in the above-identified patent and that said Letters Patent is hereby corrected as shown below:

In the Specification

Column 5, Detailed Description of Specific Embodiments, Line 7 -- Delete "(IVIES)" and insert --(MES)-- therefor In the Claims Column 12, Line 26 -- In Claim 1, after "rule", delete "is"

Signed and Sealed this
Seventh Day of October, 2025

John A. Squires
*Director of the United States Patent and Trademark Office*